United States Patent [19]

Niijima et al.

[11] Patent Number: 5,640,098
[45] Date of Patent: Jun. 17, 1997

[54] IC FAULT ANALYSIS SYSTEM HAVING CHARGED PARTICLE BEAM TESTER

[75] Inventors: Hironobu Niijima, Ohizumi-machi; Hiroshi Kawamoto, Menuma-machi; Akira Goishi, Kazo; Masayuki Kurihara, Gyoda; Toshimichi Iwai, Tokyo, all of Japan

[73] Assignee: Advantest Corporation, Tokyo, Japan

[21] Appl. No.: 593,549

[22] Filed: Jan. 30, 1996

Related U.S. Application Data

[63] Continuation of Ser. No. 336,838, Nov. 9, 1994, abandoned.

[30] Foreign Application Priority Data

Nov. 9, 1993 [JP] Japan ................................. 5-304746
Nov. 9, 1993 [JP] Japan ................................. 5-304747

[51] Int. Cl.$^6$ .................................................. G01R 31/305
[52] U.S. Cl. ............................................ 324/751; 364/488
[58] Field of Search ............................. 324/158.1, 751; 250/310, 311; 364/488

[56] References Cited

U.S. PATENT DOCUMENTS 5,325,309  6/1994  Halaviati et al. ..................... 364/488

FOREIGN PATENT DOCUMENTS 014534  8/1986  European Pat. Off. .
2258083  1/1993  United Kingdom .

*Primary Examiner*—Kenenth A. Wieder
*Assistant Examiner*—Russell M. Kobert
*Attorney, Agent, or Firm*—Knobbe, Martens, Olson & Bear, LLP

[57] ABSTRACT

An IC fault analysis system which is capable of accurately correlating mask layout data and/or net listing data associated with CAD (computer aided design) data developed in the IC design and an image obtained by a non-contact type tester such as an electron beam tester. The IC fault analysis system includes a circuit diagram display for showing a circuit diagram of the IC device under test based on the CAD data, a mask layout display for showing a mask layout of the IC device under test based on the CAD data, a contrast image display for showing a potential distribution of the IC device under test obtained in the non-contact type tester, an input means connected to the circuit diagram display for specifying a circuit component of the IC device under test, a comparison means for comparing the circuit diagram of the circuit component defined by the input means and contrast image corresponding to the circuit component, and a comparison data memory for storing the comparison data of the comparison means and providing the comparison data to the contrast image display.

6 Claims, 7 Drawing Sheets

NET LIST

| CELL NO. | PIN 1A | PIN 2B | PIN 3Z | |
|---|---|---|---|---|
| X1 | IN1 | IN2 | OUT1 | AND21 |
| X1 | IN3 | IN4 | OUT2 | AND21 |
| X1 | OUT1 | OUT2 | OUT3 | NAND21 |

5,640,098

IC FAULT ANALYSIS SYSTEM HAVING CHARGED PARTICLE BEAM TESTER

This application is a continuation of U.S. patent application Ser. No. 08/336,838, filed Nov. 9, 1994, now abandoned.

FIELD OF THE INVENTION

This invention relates to an IC fault analysis system for use in evaluating a semiconductor integrated circuit, typically in a design and development stage of the semiconductor integrated circuit, and more particularly, to an IC fault analysis system having an improved capability of displaying and exchanging analysis data.

BACKGROUND OF THE INVENTION

In manufacturing IC (integrated circuit) devices, circuit net listing CAD (computer aided design) data and mask layout CAD data are generally used for automatically determining the mask layout including the wiring pattern in an IC device.

To evaluate a prototype IC device by, for example, locating defective points in the IC device which is experimentally produced, the circuit net listing CAD data and the mask layout CAD data that have been established and used for the production of the IC are formerly used. In such a conventional method, a defective point is specified with reference to a current or voltage waveform in each circuit component of the IC device by determining an interrelationship between the circuit net listing and the mask layout based on the CAD data.

The applicant of this invention disclosed an IC fault analysis display device of this kind in the Japanese Patent Application Serial number 1993-184,055, which is the prior art of this invention. A simplified block diagram of the IC fault analysis display device in the patent application is shown in FIG. 3.

In FIG. 3, the IC fault analysis display device 20 is connected with memory devices 10, 11 and 12 each of which is a floppy disk or hard disk or other kind of memory device. The IC fault analysis display device 20 is also connected to an input means 13 and an IC internal circuit analysis device 40.

The circuit net listing CAD data that has been used in the production of the IC is loaded in the outside memory device 10. The mask layout CAD data that has been used in the production stage is loaded in the outside memory device 11. Pin input-output attribute information is loaded in the outside memory device 12. Since the pin input-output attribute information is fixed data as will be described later, it can be stored in a memory device provided inside of the IC fault analysis display device 20.

The data read out from these outside memory devices 10, 11 and 12 are input to the IC fault analysis display device 20 having a computer therein. The IC fault analysis display device 20 comprises a net list data conversion part 21, a mask layout data conversion part 22, a net list vs. mask layout comparison part 23, a net list-circuit diagram generation part 24, a circuit diagram vs. mask layout comparison part 25, a net list data memory 26, a circuit diagram data memory 27, a mask layout data memory 28, a comparison data memory 29, a net list display 30, a circuit diagram display 31, and a mask layout display 32.

The net list data conversion part 21 and the mask layout data conversation part 22 respectively convert the format of the net listing CAD data and the mask layout CAD data to a format acceptable to the IC fault analysis display device 20.

The net listing data and the mask layout data that were converted to the net list data conversion part 21 and the mask layout data conversion part 22 are stored in the net list data memory 26 and the mask layout data memory 28, respectively. Then, each information in the net listing data is compared with the corresponding information in the mask layout data by the net list vs. mask layout comparison part 23.

The pin input-output attribute information from the memory 12 is input to the net list-circuit diagram generation part 24. The net list-circuit diagram generation part 24 generates a circuit diagram based on the pin input-output attribute information and the net listing data from the net list data conversion part 21.

In the IC fault analysis display device of FIG. 3, the pin input-output attribute information includes various names showing the kinds of elements provided in the IC device and also the names of terminals in the IC device. For example, R designates a resistor, L is an inductance, D is a diode, AND21 is AND gate of two inputs and one output. Other names indicating the kinds of elements like, C, J, V, I, Q, P, N and NAND are also included.

As for the name of the terminals of each element, in the case of C resistor R for example, the first pin is designated by A indicating an input terminal and the second pin is designated by Z indicating an output terminal. In the case of a junction field effect transistor J, the first pin is designated by G which indicates a gate terminal, the second pin designated by S indicating a source terminal, and the third pin is D indicating a drain terminal. Thus, by identifying a pin input-output attribute of each element, the net list-circuit diagram generation part 24 can read out a diagram pattern of each element and define each terminal of the element in the diagram pattern.

Namely, from a net listing shown in FIG. 4, a circuit diagram shown in FIG. 5 can be depicted. As in FIGS. 4 and 5, the cell number X1, for example, is a two-input-one-output AND gate having two input terminals A and B connected to the wirings IN1 and IN2, respectively, and one output terminal Z connected to the wiring OUT1. The cell number X2 is also a two-input-one-output AND gate having two input terminals A and B connected to the wirings IN3 and IN4, respectively, and one output terminal Z connected to the wiring OUT2. The cell X3 is a two-input-one-output NAND gate and has a first input terminal A connected to the wiring OUT1 and a second input terminal B connected to the wiring OUT2 and an output terminal Z connected to the wiring OUT3.

As soon as the circuit diagram data that has been generated in this way is stored in the circuit diagram data memory 27, the circuit diagram data is compared with the mask layout data and the net listing data by the circuit diagram vs. mask layout comparison part 25 to find out the corresponding points in the data. The corresponding circuit diagram, the mask layout and the net listing which indicate the same part of the IC device thus determined by the circuit diagram vs. mask layout comparison part 25 are illustrated on each of the displays 31, 32 and 30. The comparison data memory 29 stores the comparison data from the comparison part 25.

After storing all the circuit diagram data in the circuit diagram memory 27, the diagram display 31 displays the overall circuit diagram by selecting the functions indicated on an initial menu screen. An input means 13, such as a mouse, is used for identifying the specific position in the overall circuit diagram to be analyzed. The circuit diagram thus identified will be disclosed on the circuit diagram display 31 as shown in FIG. 6. In addition to the circuit diagram display, the net list and the mask layout are also displayed simultaneously on the display device 20 based on a multi-task function as shown in FIG. 6.

Therefore, by selecting the point of the IC to be analyzed in the circuit diagram shown in the circuit diagram display part 31, the comparison data memory 29 sends a control signal to the net list display 30 and the mask layout display 32 so that the net list and the mask layout corresponding to the selected point in the circuit diagram are displayed on the net list display 30 and the mask layout display 32. Furthermore, a particular wiring in the selected point can be highlighted on the net list display and the mask layout display by identifying such wiring through the input means 13. Such highlighting can be accomplished by brightening or flickering the selected wiring on the displays.

The selection of the specific part of the IC device for evaluation through the input means 13 can be performed not only on the circuit diagram display 31 but also on the net list display 30 or the mask layout display 32. Also, by designating the special part in either of the displays, it can be constituted that such a specific point and the points corresponding to the specific point can be indicated with flickers, brightened illustrations or bold lines on the displays 30, 31 and 32.

Further, the positional information included in the mask layout data is provided to the IC internal circuit analysis device 40 from the mask layout display 32. The IC internal circuit analysis device 40 analyzes the inside points of the IC device corresponding to the selected point on the circuit diagram. One of the examples of the IC internal circuit analysis device is a device formed of a charged particle beam tester such as an electron beam tester (EB tester) or an ion beam tester. The other type of the IC inside analysis device is formed of a optical microscope.

For example, in the charged particle beam tester, the IC device to be tested is arranged in a vacuum chamber of the beam tester. The charged particle beam is irradiated from the beam generator of the tester and the irradiated beam is scanned on the predetermined area of the IC device under test. As a result, the charged beam causes the emission of secondary electrons from the IC device under test, the amount of which is dependent upon the electric potential of a circuit point of the IC device receiving the beam. The amount of the secondary electron that occurs by the charged beam irradiation is measured in the form of an electric signal for every irradiation point in the IC device.

The measured data is processed by the charged particle beam tester so that a potential contrast image (SEM image: Scanning Electron Microscope image or SIM image: Scanning Ion Microscope image) and waveform data for the inside of the IC are formed. The potential contrast image data and the waveform image data are stored in a contrast image data memory and a waveform data memory (not shown), respectively. The potential contrast image and the waveform image of the specified location of the IC device are displayed on a display screen incorporated in the IC internal circuit analysis device 40.

The positional information provided to the IC internal circuit analysis device 40 from the mask layout display 32 includes X-Y coordinate data for identifying a position in the IC device and magnification data for indicating a size of an area in the IC device. Each irradiated position of the IC device under test can be designated by this positional information.

However, due to an inaccuracy occurred during the IC production or in the IC internal circuit analysis device, the mask layout data from the mask layout 32 and the potential contrast image do not completely match with each other. Therefore, in the conventional device of FIG. 3, a user has to fine-tune the X, Y coordinate positions of the IC device under test by comparing the mask layout and the observed contrast image. After completely adjusting the positions between the mask layout and the contrast image in the IC internal circuit analysis device 40, the evaluation of the IC under test is performed by monitoring the potential contrast image and the waveform displayed on the screen of the analysis device 40.

As described above, in the conventional IC defective analysis device of FIG. 3, the IC fault analysis display device 20 that analyzes information that obtained from CAD data for IC production and the IC internal circuit analysis device 40, which is typically on electron beam tester, do not suitably match with each other. This is because the conventional IC fault analysis system such as shown in FIG. 3 does not have means to correct the positional differences between the CAD data and the measured data obtained by IC internal circuit analysis device 40. Therefore, the interface between the two devices is not well established. For example, the exchange of data between the two devices was insufficient.

Therefore, it is difficult to establish correlationship between the mask layout or the net listing and the observed contrast image or the waveform image on the displays. The user has to input net names through a keyboard one by one for each contrast image and the waveform image displayed in the analysis device 40 corresponding to the selected portion of the IC device. Alternatively, the user has to take a memo or record a note in a print showing such images. Thus, in the conventional device, it is time consuming and tedious to determine the correlationship between the CAD data and the images in the beam tester.

Further, in the conventional device, the information flow between the IC fault analysis display device 20 and the IC internal circuit analysis device 40 is one-way, i.e., data transmission of the CAD data from the IC fault analysis display device to the IC internal circuit analysis device. Namely, there is no information flow from the charged beam tester 40 to the fault display device 20. However, in the practice of evaluating the IC devices, a user may discover the defective points of the IC device by observing the contrast image and the waveform image obtained in the charged particle beam tester. In such a case, a defective point found in the potential contrast image must be estimated its position by observing the mask layout display and the circuit diagram and then the accurate position of such defective point has to be confirmed by sending the mask layout data of the estimated position to the charged beam tester. This process in the conventional device is complicated, inconvenient and time consuming.

SUMMARY OF THE INVENTION

Therefore, it is an object of the present invention to provide an IC fault analysis system which is capable of integrating an IC defect analysis device for processing IC device CAD data and an observed image in an IC internal circuit analysis device for analyzing internal electric potential and waveforms in a non-contact manner to freely exchange and display data therebetween by identifying a specific circuit component shown in a circuit diagram display associated with the IC CAD data.

To achieve this object, the IC fault analysis system of the present invention forms a work station by integrating all of the displays and controllers of the IC defective analysis device and the IC internal circuit analysis device. A waveform data memory, a waveform image display, a contrast image data memory and a contrast image display are installed within the work station and interconnected with each other including circuit diagram display and the mask layout display associated with the CAD data of the IC device to be evaluated. A circuit diagram vs. measurement data comparison part and an additional comparison data memory are provided to determine the correlationship between the measurement data, i.e., the waveform image data and contrast image data from the IC internal circuit analysis device, and the circuit diagram data derived from the CAD data. An input means is connected to the circuit diagram display to select a circuit component on the circuit diagram display.

According to the present invention, the fault analysis system shows a circuit diagram on the circuit diagram display, and at the same time, a mask layout, a net listing, a contrast image and a waveform image are also displayed on the corresponding displays. In the circuit diagram display, each net name is provided to the corresponding circuit component. By specifying the circuit component in the circuit diagram display, a net name is indicated for the specified component in the net listing display and the circuit position corresponding to the specific circuit component in the mask layout display by blinking, brightening or other highlighting means. The contrast image display and the waveform image display also carry the net name of the specified circuit component. A print can produce the same or similar type of illustrations shown on the displays.

Thus, by designating a circuit component of interest through the input means, inter-relationship between the various types of displays is shown on each display and/or printed out in a paper form, which considerably increases the efficiency and accuracy of the IC fault analysis.

Another object of the present invention is to provide an IC fault analysis system which is capable of integrating an IC defect analysis device for processing IC device CAD data and an observed image in an IC internal circuit analysis device for analyzing a circuit diagram, a mask layout and a net listing of the IC device to be tested by identifying a specific portion in a contrast image or a waveform image obtained in the IC internal circuit analysis device.

To achieve this object, the fault analysis system of the present invention forms a work station by integrating all of the displays and controllers of the IC defective analysis device and the IC internal circuit analysis device. A waveform data memory, a waveform image display, a contrast image data memory and a contrast image display are installed within the work station and interconnected with each other including circuit diagram display and the mask layout display associated with the CAD data of the IC device to be evaluated. A circuit diagram vs. measurement data comparison part and an additional comparison data memory are provided to determine the correlationship between the measurement data, i.e., the waveform image data and contrast image data from the IC internal circuit analysis device, and the circuit diagram data derived from the CAD data. An input means is connected to a switch circuit which establishes connection from the input means to either of the mask layout display or the contrast image display.

In an initial setting, an overall mask layout is illustrated in the mask layout display and an overall net listing is illustrated in the net list display. When a particular part of the IC device is specified in the mask layout display through the input means, positional information showing the location of the specified part is sent to the IC internal circuit analysis device from the mask layout display. The IC internal analysis device starts analyzing the specified part of the IC device and illustrates the potential contrast image on the contrast image display. By comparing the contrast image and the mask layout, positional mismatch between the two is corrected.

After the adjustment, in a measurement setting, the adjustment data is used to automatically calibrate the measuring point specified on the contrast image display. By specifying a particular part in the contrast image, a net name will be illustrated on the contrast image display and at the same time, the corresponding displays as specified in the contrast image display will be illustrated in the other displays by blinking, intensifying, bold lines or other means.

DETAILED DESCRIPTION OF THE PREFERRED EMBODIMENT

Figure 1:
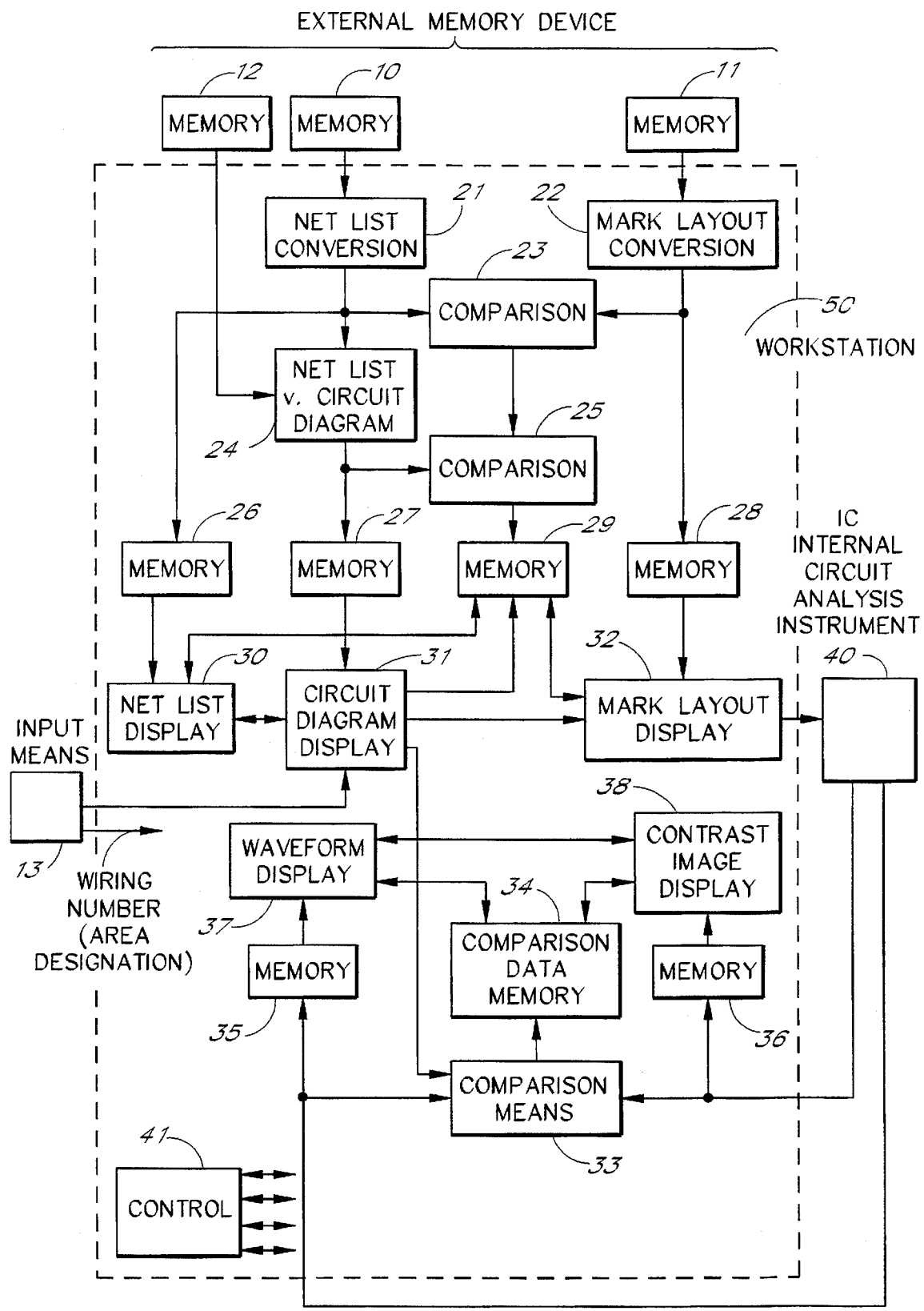
FIG. 1 is a block diagram showing a configuration of one of the preferred embodiments of the present invention.
Figure 2:
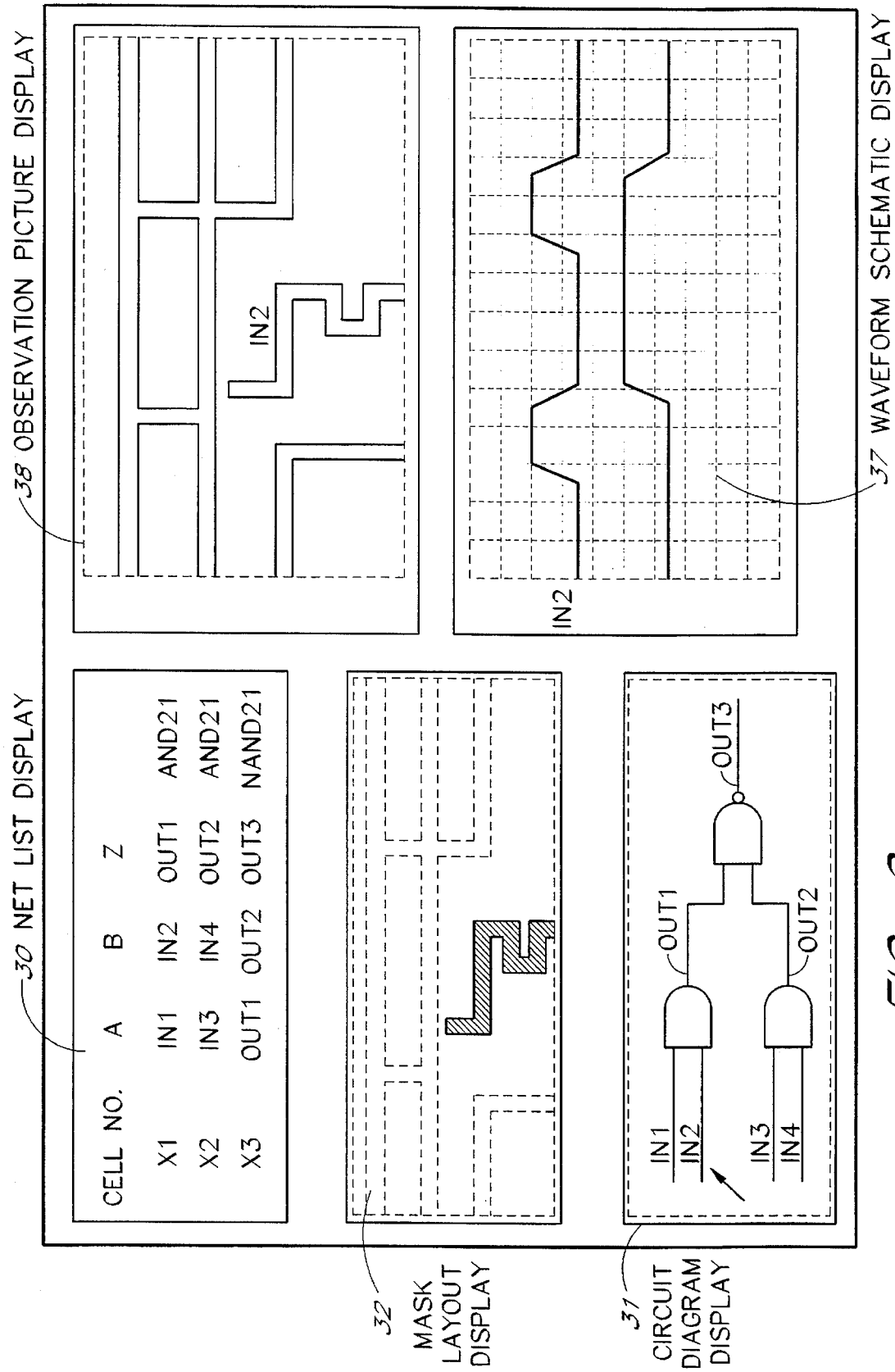
FIG. 2 is a graphic view showing an example of multiple displays in the work station in accordance with the preferred embodiment of FIG. 1.
Figure 3:
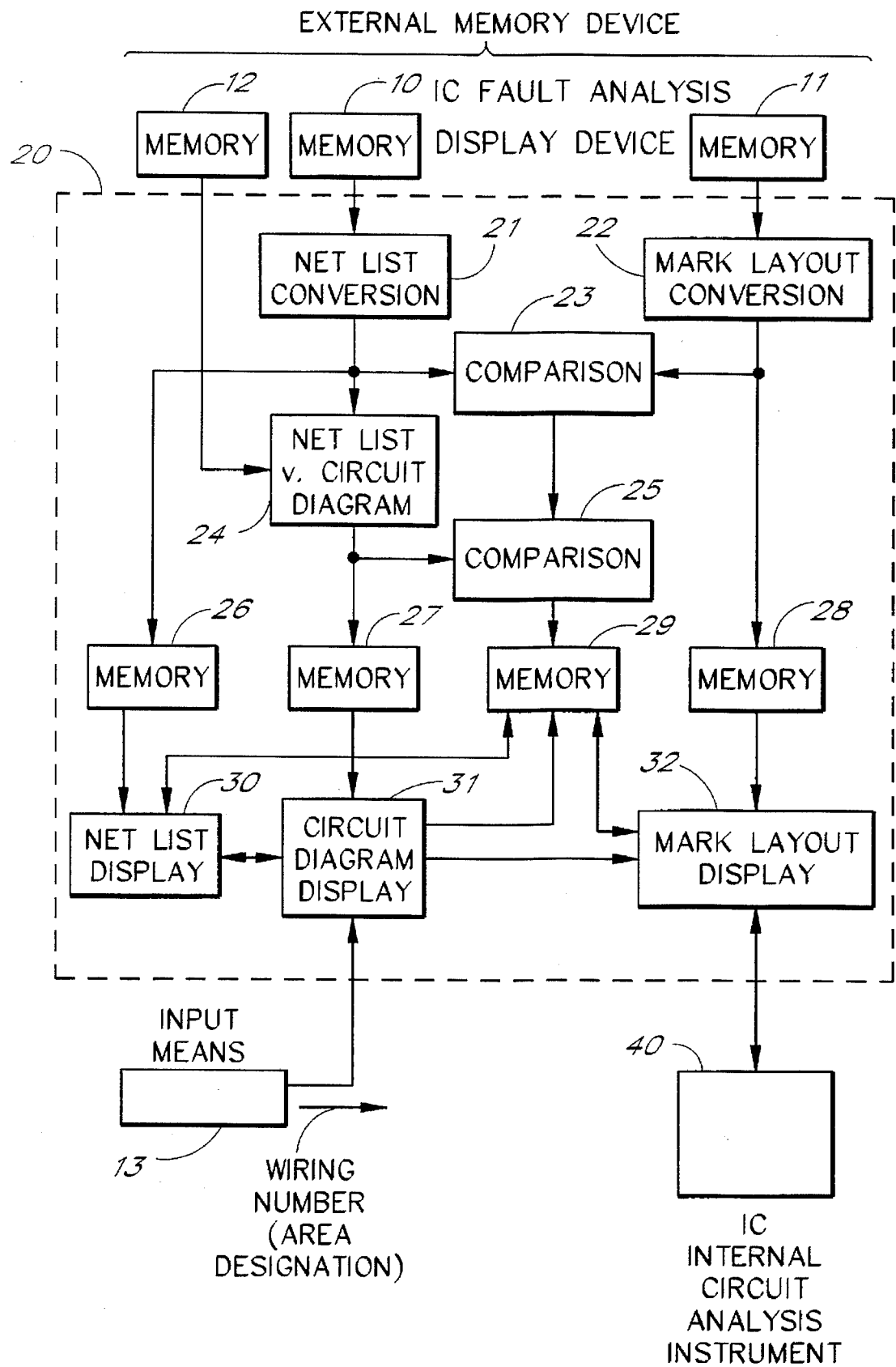
FIG. 3 is a block diagram showing a configuration of a conventional fault analysis system.
Figures 4, 5:
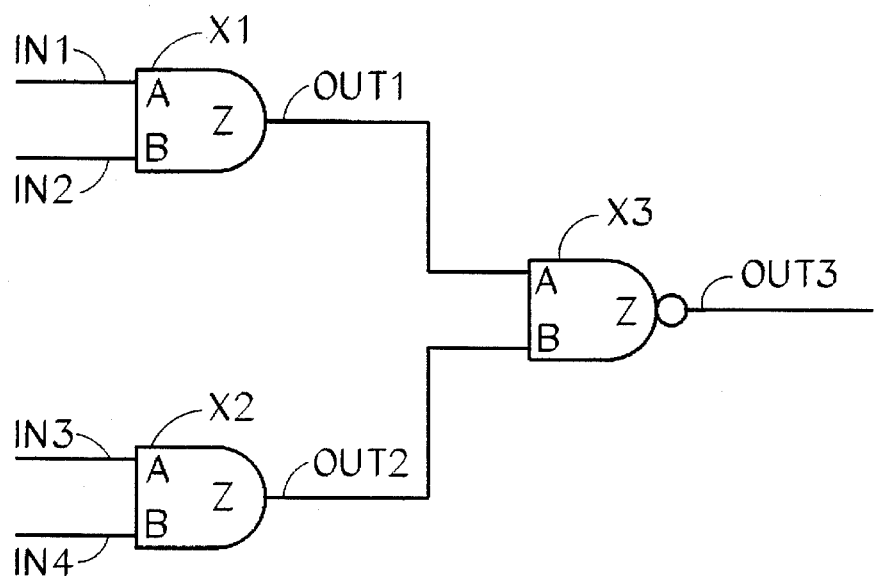
FIG. 4 is a graphic view showing an example of net listing displayed by IC analysis systems.
FIG. 5 is a graphic view showing an example of a circuit diagram displayed by IC fault analysis system.
Figure 6:
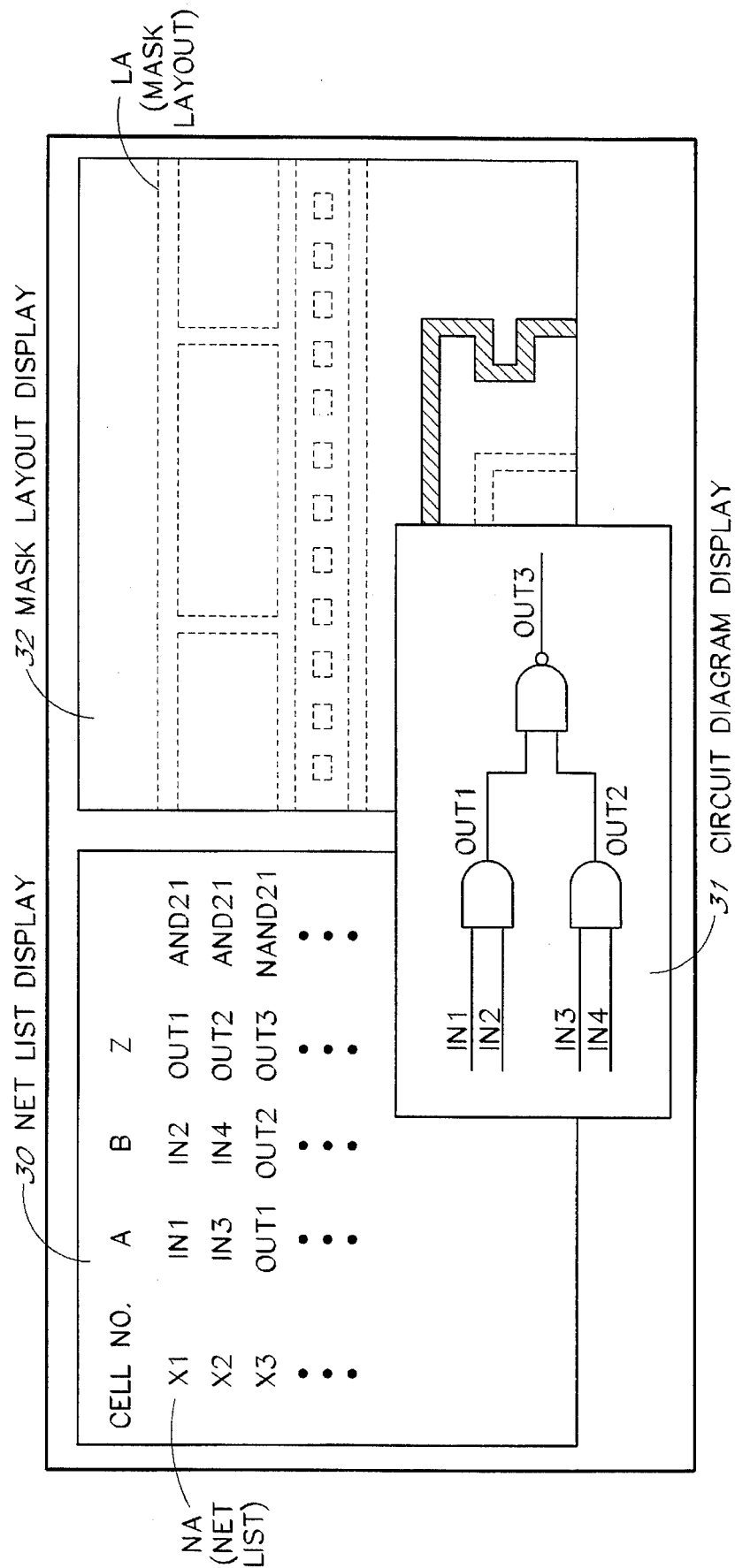
FIG. 6 is a graphic view showing an example of multiple displays in the conventional system of FIG. 3.

FIG. 1 shows a block diagram of one of the preferred embodiments of the present invention. The parts that correspond with that of FIG. 3 are denoted by the same reference numerals. In the present invention, a contrast image data memory 36, a contrast image display 38, a waveform image data memory 35 and a waveform image display 37 in a conventional IC internal circuit analysis device are integrated into a conventional IC fault analysis display device to form a work station 50. A circuit diagram vs. measurement data comparison part 33 and a second comparison data memory 34 are newly provided in the work station 50. As noted above, the circuit diagram is obtained from the CAD data produced in desgning the IC devise while the measurement data is obtained by the charged beam particle tester. Thus, the comparison part 33 and the second comparison data memory established positional relationship between the CAD data and the measured data. A computation control part 41 performs necessary computation and control processes for the IC fault analysis system.

The circuit diagram vs. measurement data comparison part 33 receives the contrast image data and the waveform image data from the IC internal circuit analysis device 40. Further, the comparison part 33 receives data including the net name and the coordinate data identified by the mask layout data from the circuit diagram display 31. The data from the circuit diagram display 31 is compared with the contrast image data and the waveform image data by the comparison part 33 to determine the correlationship among the data. The net name is given to the corresponding contrast image data and waveform image data. Such comparison data is stored in the second comparison data memory 34.

The potential contrast image data memory 36 receives and stores therein the contrast image data obtained by the IC internal circuit analysis device 40. The waveform image data memory 35 receives and stores therein the waveform image data from the IC internal circuit analysis device 40. Such data is generated by scanning the electron beam, for example, on the IC device to be tested.

The potential contrast image display 38 receives the image data from the image data memory 36 to display the potential contrast image obtained by observing the secondary electron emitted from the IC device under test in response to the irradiation of the electron or ion beam. The potential contrast image display 38 also receives the X-Y coordinate data and the net name of the mask layout corresponding to the circuit portion shown in the contrast image from the second comparison data memory 34. Based on the data from the memory 34, the net name will be illustrated on the contrast image display to indicate the name of the circuit component under evaluation. The position of the net name in the contrast image display is determined by the X-Y coordinate data from the second comparison data memory 34. Alternatively, the net name can be illustrated in other position such as at the upper right position of the display screen.

The waveform image display 37 receives the waveform data from the waveform data memory 35 to display the potential contrast image obtained by observing the secondary electron emitted from the IC device under test in response to the irradiation of the electron or ion beam. The waveform image display 37 also receives the X-Y coordinate data and the net name of the mask layout corresponding to the waveform image from the second comparison data memory 34. Based on the data from the memory 34, the net name will be illustrated on the waveform image display to indicate the name of the circuit portion of the IC device generating the waveform. Because the data from the second comparison memory 34 provides accurate physical relationship between the images displayed on the displays 37 and 38 with respect to any specified circuit component of the IC device under test, the IC fault analysis system on FIG. 1 realizes an accurate IC fault analysis with high efficiency.

As described above, showing the net name on the displays 37 and 38 is convenient in the measurement of the IC device. However, it is also possible to obtain such illustrations only in a paper form by printing out such data without changing the displays. Such printout may also accompany additional information.

In the foregoing description, the IC fault analysis system includes various kinds of display. However, it is not necessary to install all of the display in the IC fault analysis system. For example, some of the displays can be obviated and replaced by a printer which prints out the corresponding illustration in a paper form.

As explained above, in the present invention, since the net name of the specified circuit component in the net listing data associated with the CAD data is automatically given to the corresponding potential contrast image, the test procedure becomes considerably simple and easy, which is also able to avoid careless errors in the IC evaluation.

Figure 7:
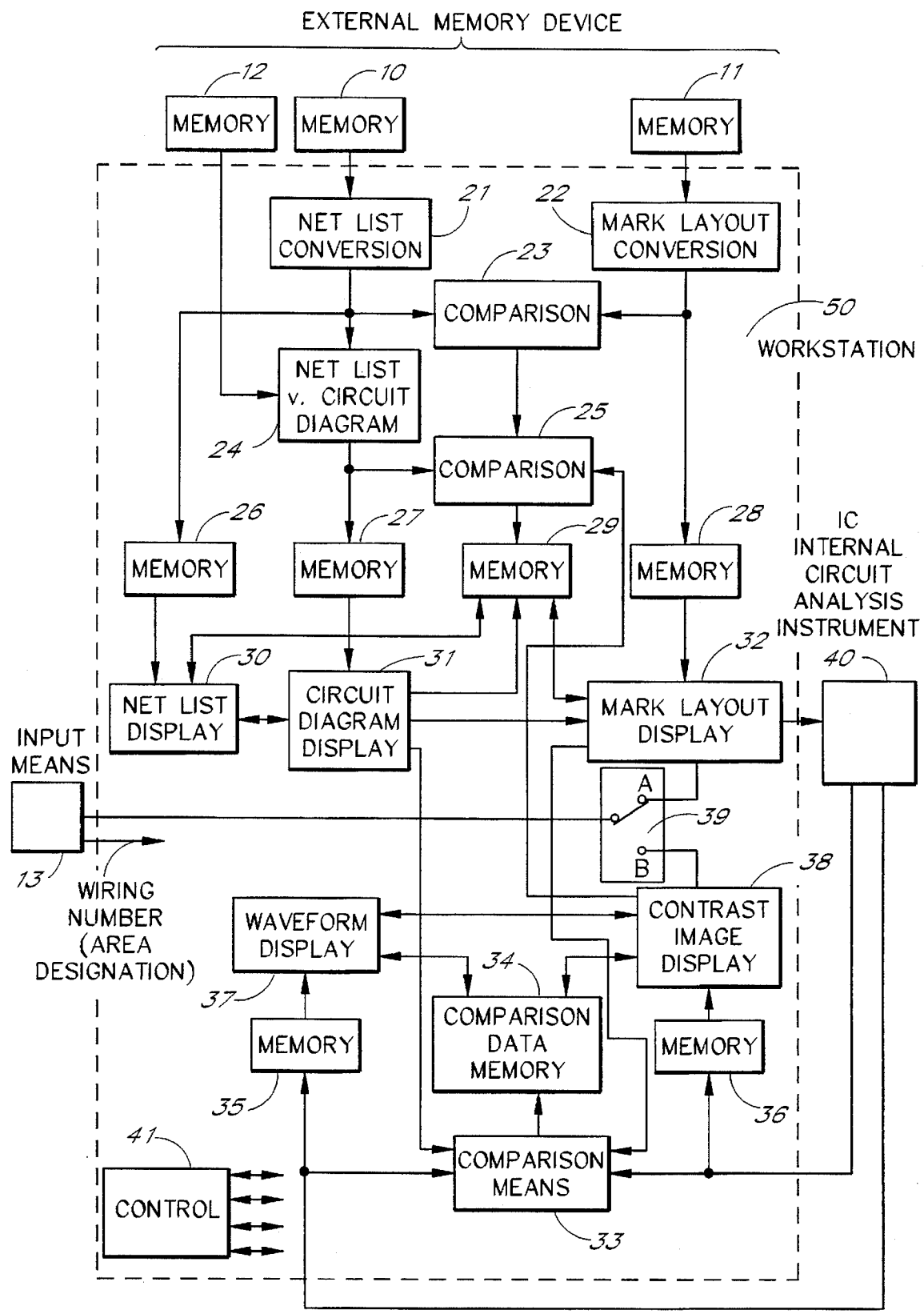
FIG. 7 is a block diagram showing a configuration of second embodiment of the present invention.

FIG. 7 shows a block diagram of another preferred embodiment of the present invention. The parts that correspond to that of FIG. 1 are denoted by the same reference numerals. In this invention, a switch circuit 39 is provided between the mask layout display 32 and the contrast image display 38. The contrast image display 38 is also connected to the circuit diagram vs. mask layout comparison part 25 to provide data of positional adjustment. The mask layout display 32 is also connected to the circuit diagram vs. measurement data comparison part 33 to provide the X-Y coordinate data.

As a preparatory step, the switch circuit 39 switches to a terminal A so that the input means 13 is connected to the mask layout display 32. The overall circuit diagram of the IC device under test is illustrated in the circuit diagram display 31 by the initial setting of the menu, when all of the circuit diagram data is given to the circuit diagram data memory 27. In this initial setting, the overall mask layout is illustrated in the mask layout display 32 and overall net listing is illustrated in the net list display 30.

When a particular part of the IC device is specified in the mask layout display 32 through the input means 13, the circuit diagram and net list corresponding to the specified part of the IC device are displayed on the circuit diagram display 31 and the net listing display 30, respectively, based on the data from the first comparison data memory 29. At the same time, positional information showing the location of the specified part is sent to the IC internal circuit analysis device 40 from the mask layout display 32. The IC internal circuit analysis device 40 starts analyzing the specified part of the IC device and illustrates the potential contrast image on the contrast image display 38. As described above, due to the inaccuracy involved, the contrast image and the mask layout do not completely agree one another at first. Therefore, a user corrects the small differences of position between the two by adjusting the position in the X and Y axes.

Preferably, by the end of a preparatory step, such adjustment of X-Y coordinate between the mask layout and the contrast image are performed for three or four points of the IC device and such adjustment data is stored in the memory. For example, the X-Y coordinate data of the mask layout are taken into the circuit diagram vs. measurement data comparison part 33 from the mask layout display 32. The adjustment data for the three or four points above is stored in the second comparison data memory part 34. The adjustment data may also transmitted to the first comparison data memory 29 through the contrast image display 38 and the circuit diagram vs. mask layout comparison part 25. The stored adjustment data is used as a reference for automatically correcting the positional differences in the other points of the IC device.

In the measurement stage, the switch circuit 39 is changed to a terminal B to connect the input means 13 to the potential contrast image display 38. The user can specify various points on the IC device to monitor the potential contrast image through the input means 13. If there still exists a positional mismatch between the observed contrast image and the mask layout, the user of the system can fine tune the X and Y coordinates to eliminate such mismatch.

A fault of the IC device under test is monitored on the contrast image display by changing the positions in the X-Y coordinate. The amount of change in the position is notified to the circuit diagram vs. mask layout comparison part 25 from the contrast image display 38. The data showing the amount of change in the position is further notified to the mask layout display 32, the circuit diagram display 31 and net list display 30, all of which automatically show the corresponding illustration based on the position data.

When defective part is discovered by the observation of the contrast image, if necessary, a further adjustment may be performed for achieving the complete agreement between the contrast image and the mask layout.

Figure 8:
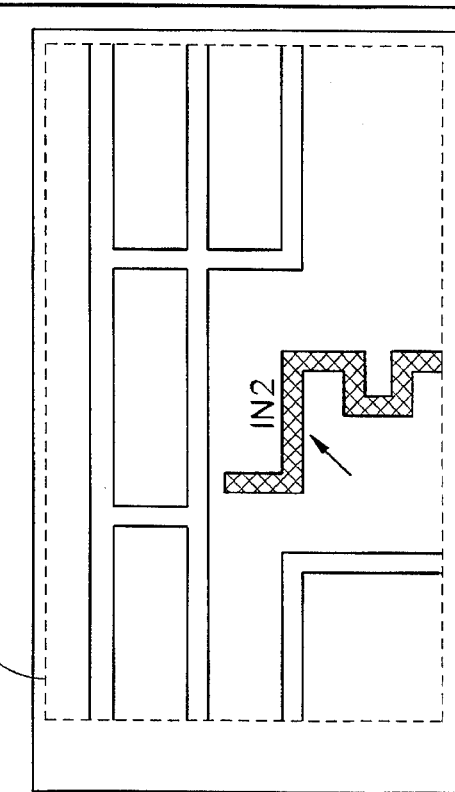
FIG. 8 is a graphic view showing an example of multiple displays in the work station in accordance with the preferred embodiment of FIG. 7.
Figure 8:
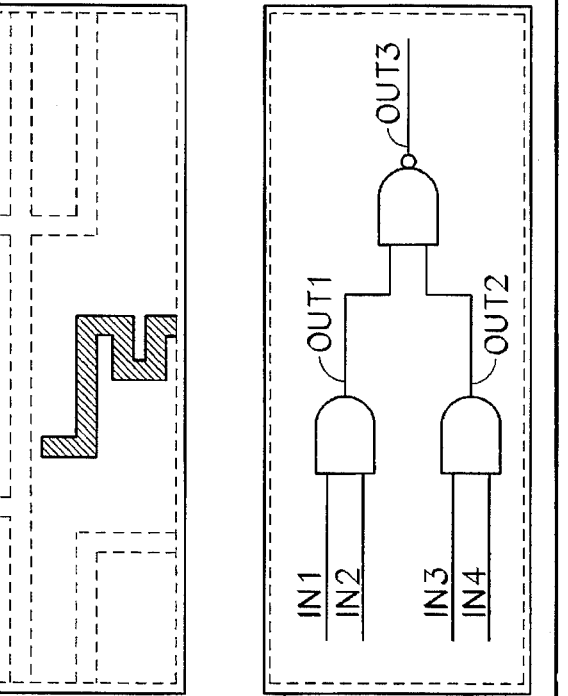

As shown in FIG. 8, a net name will be illustrated on the contrast image display 38 by identifying any specific positions of interest in the contrast image by the input means 13. At the same time, the corresponding displays as specified in the contrast image display will be illustrated in the other displays by blinking, intensifying, bold lines or other means.

In the foregoing description, since the specific position of the mask layout and the net name can be illustrated by designating a particular part shown in the potential contrast image, the fault analysis based on the IC internal circuit analysis device can be effectively performed. It is also possible to specify a waveform portion in the waveform image display instead of the contrast image. Further, in the above embodiment example, the switching operation by the switch circuit 39 can be replaced with other means such as a mouse in a manner well known in the art.

As explained above, in the present invention, since the information of the IC device in the CAD data and the image data are correlated and exchangeable, the test procedure becomes considerably simple and easy and the IC fault analysis system can accomplish a highly accurate IC analysis.

What is claimed is:

1. An IC fault analysis system for evaluating a semiconductor IC device, comprising:

a circuit diagram display for showing a circuit diagram of the IC device under test based on CAD (computer aided design) data:

a mask layout display for showing a mask layout of the IC device under test based on the CAD data;

a contrast image display for showing electric potential in each circuit component of the IC device under test obtained by a charged particle beam tester;

an input means connected to the IC fault analysis system for specifying a circuit component of the IC device under test;

a comparison means for comparing data associated with positions between the circuit diagram of the circuit component in the IC device specified by the input means and the contrast image corresponding to said circuit component; and a comparison data memory for storing the comparison data from the comparison means and providing the comparison data to the contrast image display and the mask layout display;

wherein the specified circuit component in the IC device is highlighted on both the contrast image display and the mask layout display based on the data from the comparison data memory to correct positional errors caused by the CAD data and the charged particle beam tester.

2. An IC fault analysis system as defined in claim 1 further including:

a net listing display for showing a net list of each component in the IC device based on the CAD data, a specified part of the net list being highlighted for showing relationship with the corresponding component in the contrast image.

3. An IC fault analysis system as defined in claim 1 further including:

a waveform image display for showing a waveform of the component in the IC device defined by the input means, the waveform being obtained by the non-contact tester, a specified part of the waveform being highlighted for showing relationship with the corresponding component in the mask layout.

4. An IC fault analysis system for evaluating a semiconductor IC device, comprising:

a mask layout display for showing a mask layout of the IC device under test based on the CAD (computer aided design) data produced in a design stage of the semiconductor IC device;

a contrast image display for showing a potential distribution for circuit components in the IC device under test obtained by a charged particle beam tester including an electron beam tester;

an input means selectively connected to either the mask layout display or the contrast image display for specifying a portion of the circuit component in the IC device under test;

a comparison means for comparing data related to positions of the specified circuit component in the mask layout and the contrast image of the IC device specified by the input means; and a comparison data memory for storing the comparison data of the comparison means and providing the comparison data to the mask layout display and the contrast image display;

wherein the specified circuit component in the IC device is highlighted on both the contrast image display and the mask layout display based on the data from the comparison data memory to correct positional errors caused by the CAD data and the charged particle beam tester.

5. An IC fault analysis system as defined in claim 4 further including:

a switch circuit for selectively connecting the input means to either of the mask layout display or the contrast image display to specify the circuit component in the IC device under test.

6. An IC fault analysis system as defined in claim 4 further including:

a net listing display for showing a net list of each component in the IC device based on the CAD data;

a waveform image display for showing a waveform of the circuit component in the IC device defined by the input means, the waveform being obtained by the non-contact tester;

a circuit diagram display for showing a circuit diagram of the IC device under test based on CAD data;

wherein images on the displays are correlated with respect the specified circuit component based on the data from the comparison data memory to establish positional relationship for the circuit component among the images.

* * * * *